United States Patent [19]
Chun

[11] Patent Number: 5,567,656
[45] Date of Patent: Oct. 22, 1996

[54] PROCESS FOR PACKAGING SEMICONDUCTOR DEVICE

[75] Inventor: Dong-Suck Chun, Chungcheongbuk-do, Rep. of Korea

[73] Assignee: Goldstar Electron Co., Ltd., Cheongju, Rep. of Korea

[21] Appl. No.: 359,762

[22] Filed: Dec. 20, 1994

[30] Foreign Application Priority Data

Dec. 27, 1993 [KR] Rep. of Korea ............... 93-29910

[51] Int. Cl.$^6$ .................................................. H01L 21/60
[52] U.S. Cl. .................. 437/211; 437/209; 437/214; 437/217; 437/219
[58] Field of Search ............................... 437/209, 210, 437/211, 212, 213, 214, 215, 216, 217, 218, 219, 220

[56] References Cited

U.S. PATENT DOCUMENTS

| | | | |
|---|---|---|---|
| 5,066,614 | 11/1991 | Dunaway et al. | 437/209 |
| 5,093,281 | 3/1992 | Eshima | 437/217 |
| 5,095,361 | 3/1992 | Iwata | 437/217 |
| 5,229,328 | 7/1993 | Bregman | 437/271 |
| 5,358,906 | 10/1994 | Lee | 437/220 |

Primary Examiner—Kevin M. Picardat
Attorney, Agent, or Firm—Alan R. Loudermilk

[57] ABSTRACT

The process of the present invention is simplified by skipping the die bonding step, the wire bonding step and the trim-forming step of the conventional techniques. A semiconductor device may include: a plurality of bonding pads formed on the surface of the chip for connecting the internal circuit of the chip to an outer circuit; an insulating layer for insulating the surface of the chip, having a height higher than the height of the bonding pads, and formed on the whole surface of the chip except the portions where the bonding pads are formed; a plurality of bumps attached to the bonding pads; a plurality of pad type leads attached to the bumps; and a molding resin for covering the whole surface of the chip except the portions where the leads are disposed.

9 Claims, 3 Drawing Sheets

PROCESS FOR PACKAGING SEMICONDUCTOR DEVICE

FIELD OF THE INVENTION

The present invention relates to semiconductor packaging, and more particularly to processes for packaging a light, thin and compact semiconductor package. The present invention also relates to a semiconductor device manufactured based on such a process, and also relates to lead tape used in such a packaging process.

BACKGROUND OF THE INVENTION

A semiconductor device is manufactured in such a manner that a silicon wafer is fabricated, then the chip is packaged by using epoxy or the like, in order to use the device as an electronic component. In accordance with the miniaturizing trend of electronic apparatuses, the density of semiconductor chips has increased in printed circuit boards. Thus, the package itself is gradually miniaturized, and such miniaturizing efforts are being continuously made.

As illustrated in FIG. 1, the usual semiconductor package is formed in the following manner. That is, semiconductor chip 3 is attached on lead frame paddle 1 using epoxy 2. Bonding pad 4 which is formed on the top of the chip is connected to inner lead 6 by means of metal wire 5, thereby forming an electrical connection. Epoxy molding compound 8 is molded to form a package, and outer leads 7 which project outward are bent to a proper form.

In accordance with the recent compactizing trend of the packages, paddle 1 of the lead frame is removed. Instead, the chip is secured to inner lead 4 of the lead frame by means of insulating tape 9, and semiconductor packages formed in such manner are generally used. Among them, there are a COL (chip on lead) structure in which chip 3 and insulating tape 9 are mounted as illustrated in FIG. 2, and an LOC (lead on chip) structure in which lead 4 is mounted on chip 3 as illustrated in FIG. 3.

The conventional semiconductor packaging process using the lead frame includes: a Die bonding step for attaching the chip to the lead frame; a wire bonding step for connecting the pad of the chip to the lead; and a trim-forming step for bending the outer leads. Thus, the process time is extended, and the bulk of the package is increased. Further, due to the difference between the thermal expansion coefficients of the materials (such as epoxy adhesive, the lead frame and the epoxy molding compound) which constitute the package, defects such as cracks, voids and the like are liable to occur.

SUMMARY OF THE INVENTION

It is the object of the present invention to provide a process for packaging semiconductor devices, in which the process is simplified by skipping the die bonding step, the wire bonding step and the trim-forming step of the conventional process, and the reliability of the package is improved by eliminating the defect factors originating from the lead terminal and the molding compound of the conventional packages.

In achieving the above object, a process for packaging chips after fabricating semiconductor wafers includes the steps of: (a) forming an insulating layer on a wafer after completing a wafer fabrication process, and removing the insulating layer on the portions where bonding pads are positioned; (b) cutting the wafer into a plurality of chips; (c) making connections respectively between the bonding pads of the chip and pad type leads in a lead tape having a plurality of pad type leads with a bump form thereon by matching the lead tape to the chip and applying heat and pressure so as for the bumps of the leads and the bonding pads to be bonded together; and (d) molding the chip with resin.

The chip may be installed on a printed circuit board, and then a resin is applied, thereby installing the chip in a simple manner.

The lead tape which is for connecting the bonding pad to the outer circuit is composed of: a tape with at least one side being adhesive; a plurality of pad type leads for being matched with the bonding pads of the chip, the leads being disposed on the adhesive face of the tape and bumps formed on the respective leads.

The leads and bumps are made of electrically conductive materials, and the melting point of the material for the bumps is lower than the melting point of the material for the leads.

The tape is made of polyimide or is a UV (ultra-violet) tape.

The semiconductor device of the present invention includes a plurality of bonding pads formed on a surface of a semiconductor chip for connecting an internal circuit of the semiconductor chip to an outer circuit; an insulating layer for insulating and attaching the surface of the chip except at least a portion where the bonding pads are disposed; a plurality of bumps attached on the bonding pads; a plurality of pad type leads attached on the bumps; and a molding resin for encapsulating the chip and the leads except for an opposite side to the side on which the bump is formed.

The insulating layer may be composed of a photo resist, a polyimide tape, or an ultra violet tape.

The insulating layer may be made of a photo resist, and the molding resin may be an epoxy molding compound.

The leads are attached by the help of the adhesive strengths of the bumps and the insulating layer.

In order to improve the adhesive strength in relation to the bumps, a barrier metal is coated on the leads.

Further, a semiconductor device of the present invention is composed of: bonding pads formed on the surface of the chip for connecting the internal circuit of the chip to an outer circuit; an insulating layer for insulating the surface of the chip except the portions where the bonding pads are positioned; bumps attached to the bonding pads; leads attached to the bumps; a conductive layer connected to the leads; a printed circuit board with the conductive layer formed thereon; and a molding compound for covering the printed circuit board and the chip.

BRIEF DESCRIPTION OF THE DRAWINGS

The above object and other advantages of the present invention will become apparent by describing in detail the preferred embodiments of the present invention with reference to the attached drawings in which.

DESCRIPTION OF THE PREFERRED EMBODIMENTS

Figure 7:
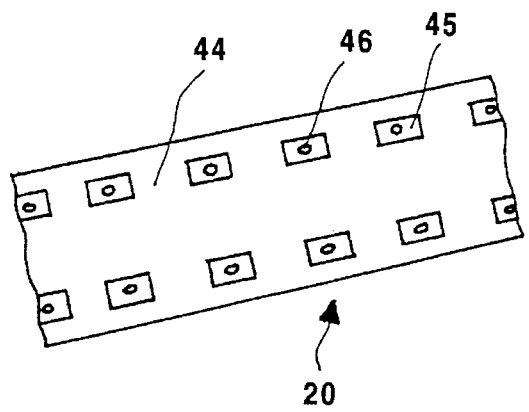
FIG. 7 illustrates lead tape, together with the arrangement of pad type leads and bumps.

As illustrated in FIG. 7, lead tape 20 according to the present invention is constituted such that pad type leads 45 are attached on tape 44 (serving as a carrier) so as for leads 45 to be matched with bonding pads 42, and that bumps 46 are formed on the respective leads 45.

The tape is made of polyimide or is an ultra violet tape. The pad type leads are electro-plated with a barrier metal for improving the adhesive strength in relation to the bumps.

As illustrated in FIG. 4, a process of the present invention is carried out in the following manner. That is, as illustrated in FIG. 4A, photo resist 41 is coated on wafer 40, after completing the semiconductor wafer fabricating process (FAB). As illustrated in FIG. 4B, the photo resist corresponding to the positions of bonding pads 42 is removed through exposure and development.

The wafer chip, in which the portions of bonding pads 42 are exposed, with the other portions being coated with the photo resist, is cut into a plurality of chips 30 by carrying out a sawing step.

Figure 1:
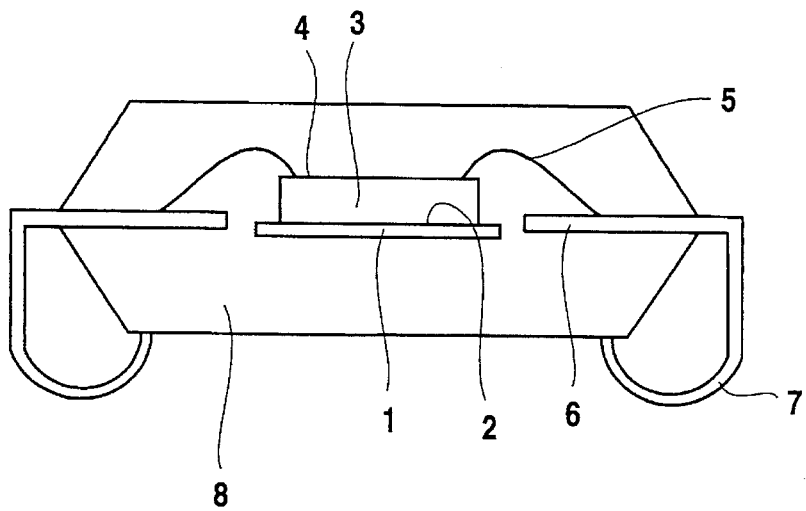
FIG. 1 is a sectional view of a conventional semiconductor device package.
Figure 2:
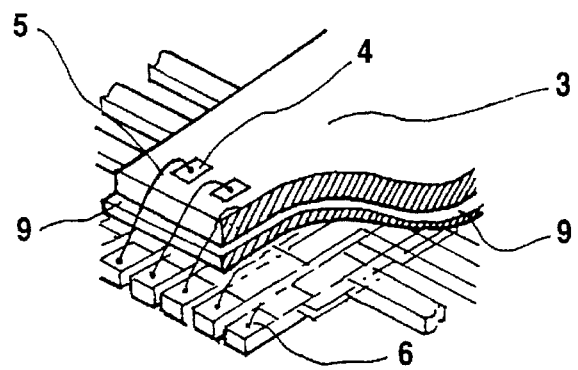
FIG. 2 is a partly sectional view of the conventional COL structure semiconductor device package.
Figure 3:
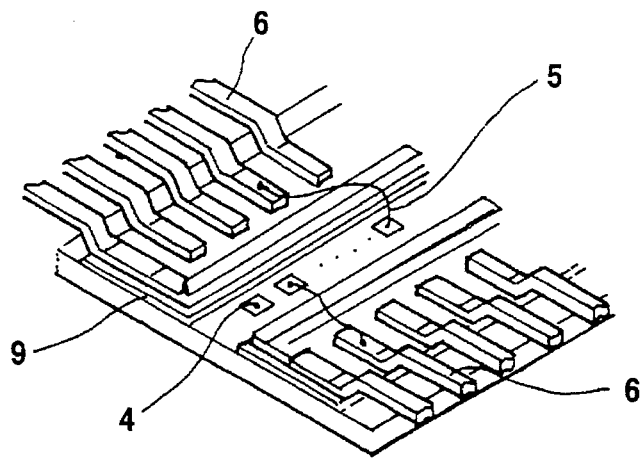
FIG. 3 is a partly sectional view of the conventional LOC structure semiconductor device package.
Figure 4A:
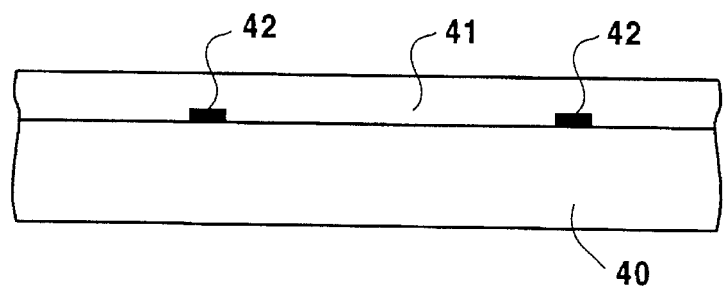
FIGS. 4A to 4E is a schematic sectional view illustrating a process for packaging semiconductor device according to the present invention.
Figure 4B:
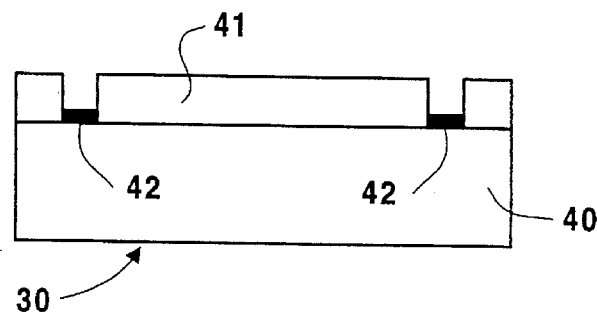
Figure 4C:
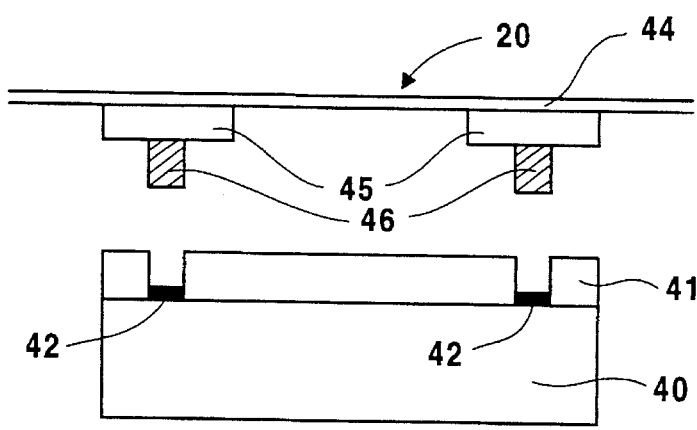

As illustrated in FIG. 4C, the chip in which the bonding pads are open is attached with lead tape 20, in such a manner that the respective bumps of lead tape 20 (which is prepared in advance) should correspond with the positions of bonding pads 42. In this process, either all of the pad type leads and the bonding pads of a chip can be attached together at the same time, or the bonding pads may be divided into several groups to attach suitable lead tapes to the respective groups, thereby carrying out the attaching process multiple times. Thus, if the attachment is made after dividing into several groups, although the number of steps are increased, the attachment becomes sure, thereby improving the reliability and decreasing the defect rate.

Figure 4D:
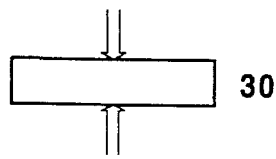

As illustrated in FIG. 4D, heat and pressure are applied so that the bumps of the leads should be attached to the bonding pads. Under this condition, the attachment is rendered firm by utilizing the adhesive affinity between the photo resist and the tape. The heat is applied from below the chip, while the pressure is applied from above the chip.

Figure 4E:
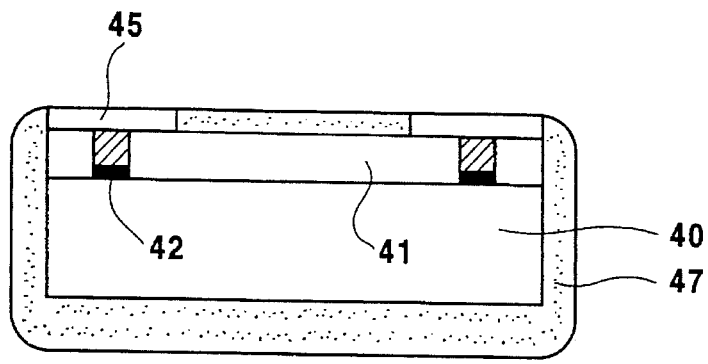

Finally as illustrated in FIG. 4E, the tape which has served as a carrier is detached, and the chip is molded using epoxy resin 47 as in the conventional process, thereby completing the semiconductor device package.

Figure 5:
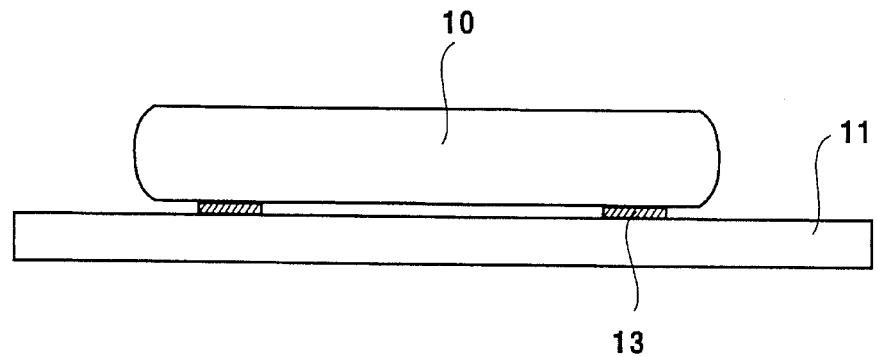
FIG. 5 illustrates a state in which the semiconductor device package of the present invention is installed on a printed circuit board.

As illustrated in FIG. 5, semiconductor device package 10 of the present invention is installed on printed circuit board 11 to conveniently make use of the semiconductor device.

Figure 6:
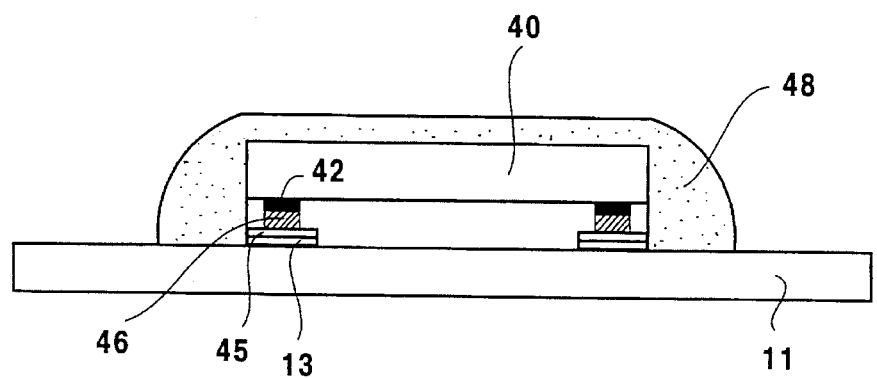
FIG. 6 illustrates a state in which the chip of the present invention is installed on a printed circuit board and, then, an encapsulation step of spreading a resin is carried out.

Alternatively, as illustrated in FIG. 6, an encapsulation method can be used in which the chip is installed directly onto the printed circuit board before the epoxy molding, with resin 48 spread thereon. In the drawing, reference code 13 indicates a wiring portion of the printed circuit board.

According to the present invention as described above, the lead frame, the metal wire and the epoxy adhesive which are required in the conventional technique are not needed. Further, the die bonding, wire bonding and trim-forming steps which are required in the conventional techniques can be eliminated.

Further, according to the present invention, the defects due to the difference of the thermal expansions of the materials can be eliminated, and a compact chip can be realized. Further, the positions of the pads can be arbitrarily selected during the design, and a diversification of the positions is possible.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A process for packaging a semiconductor device, comprising the steps of:
   (a) forming an insulating layer on a wafer after a wafer fabrication process, wherein the wafer comprises a plurality of chips having bonding pads formed thereon, and removing portions of the insulating layer on portions of the chips where the bonding pads are positioned;
   (b) cutting the wafer into a plurality of chips;
   (c) forming a plurality of leads on a lead tape, wherein each of the leads comprises a pad type lead surface adjacent to the lead tape and a bump on a surface facing away from the lead tape, wherein the leads corresponding to the bonding pads of the chips;
   (d) making connections respectively between the bonding pads of one of the chips and the leads on the lead tape by attaching the bumps of the leads to the corresponding bonding pads of the chip; and
   (e) molding the chip with resin.

2. The process of claim 1, wherein the molding step is carried out by mounting the chip on a printed circuit board and depositing the resin to cover the chip.

3. The process of claim 1, wherein the molding step is carried out by encapsulating the chip and the leads with the resin, wherein the pad type lead surface of the leads is not covered by the resin.

4. The process of claim 1, wherein the insulating layer comprises photo resist, and the removal of portions of the insulating layer comprises exposure and development of the photo resist.

5. The process of claim 1, wherein the insulating layer comprises polyimide tape.

6. The process of claim 1, wherein the insulating layer comprises ultra violet tape.

7. The process of claim 1, further comprising the step of removing the lead tape after the bumps of the leads have been attached to the corresponding bonding pads of the chip.

8. The process of claim 1, wherein the step of attaching the bumps of the leads to the corresponding bonding pads of the chip comprises matching the leads on the lead tape to the corresponding bonding pads of the chip and applying heat and pressure to the leads.

9. The process of claim 8, further comprising the step of removing the lead tape after applying heat and pressure to the leads.

* * * * *